United States Patent
Koishikawa (10) Patent No.: US 6,436,767 B1
(45) Date of Patent: Aug. 20, 2002

(54) SEMICONDUCTOR MEMORY DEVICE AND PROCESS FOR MANUFACTURING THE SAME

(75) Inventor: Yukimasa Koishikawa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/531,676

(22) Filed: Mar. 20, 2000

(30) Foreign Application Priority Data

Mar. 23, 1999 (JP) .......................................... 11-078651

(51) Int. Cl.⁷ .......................................... H01L 21/8247
(52) U.S. Cl. ..................... 438/265; 438/593; 438/595; 438/655
(58) Field of Search .................. 438/257, 264, 438/265, 267, 593, 594, 595, 634, 655, 970

(56) References Cited

U.S. PATENT DOCUMENTS 5,891,775 A * 4/1999 Hisamune ................... 438/596
5,989,960 A * 11/1999 Fukase ....................... 438/596

FOREIGN PATENT DOCUMENTS

JP 9-283643 10/1997

* cited by examiner

*Primary Examiner*—Chandra Chaudhari
(74) *Attorney, Agent, or Firm*—Foley & Lardner (57) ABSTRACT

To provide a semiconductor memory device in which no separation of a silicide layer formed on a control gate takes place and a process for manufacturing the same. A gate dielectric layer and floating gate (4 in FIG. 4) are formed on a silicon substrate. A sidewall made of polysilicon (7 in FIG. 4) is disposed on the lateral side of the floating gate in such a manner that a stop oxide layer (6a in FIG. 4) which functions as an etching stop for the polysilicon is sandwiched between the floating gate and the sidewall. A control gate (8 in FIG. 4) is laminated on the upper side of the floating gate having a step which is sloped by the sidewall in such a manner that an ONO layer (5 in FIG. 4) is sandwiched between the floating gate and the control gate.

12 Claims, 12 Drawing Sheets

2; TRENCH ELEMENT ISOLATING REGION

1; SILICON SUBSTRATE

FIG. 7(b)

4; POLYSILICON (FLOATING GATE)

3; GATE DIELECTRIC LAYER

6b; STOP OXIDE LAYER

- 4; POLYSILICON (FLOATING GATE)
- 5; ONO LAYER
- 9; SIDEWALL OXIDE LAYER
- 8; POLYSILCONE (CONTROL GATE)
- 7; POLYSILCON (SIDEWALL)
- 6a; STOP OXIDE LAYER
- 3; GATE DIELECTRIC LAYER
- 2; TRENCH ELEMENT ISOLATING REGION
- 1; SILICON SUBSTRATE

10; SILICIDE LAYER

2; TRENCH ELEMENT ISOLATING REGION
1; SILICON SUBSTRATE

FIG. 11(b) (PRIOR ART)

4; POLYSILICON (FLOATING GATE)
3; GATE DIELECTRIC LAYER

5; ONO LAYER

FIG. 11(e) (PRIOR ART)

13; DEPRESSION   8; POLYSILICON (CONTROL GATE)

SEMICONDUCTOR MEMORY DEVICE AND PROCESS FOR MANUFACTURING THE SAME

FIELD OF THE INVENTION

The present invention relates to a semiconductor memory device and a process for manufacturing the same and in particular to a semiconductor memory device which is suitable for a non-volatile memory in which a silicide layer is formed on the surface of the control gate and a process for manufacturing the same.

BACKGROUND OF THE INVENTION

Although LOCOS (Local Oxidation of Silicon) process has heretofore been used for insulating and isolating cells from each other in the floating type volatile memories reduction in cell size is difficult to achieve since the isolation width is large and the isolation breakdown voltage is low due to the presence of bird's beaks in this process. Therefore, in order to achieve reduction in the cell size, a manufacturing process in which STI (Shallow Trench Isolation) process is applied to non-volatile memories has been proposed.

In this process, a trench is formed by digging a silicon substrate at an element isolating region and an insulator is embedded in this trench. This process will now be described in brief. A buffer oxide layer and polysilicon layer each having a predetermined thickness are laminated on a silicon substrate and an oxide layer is formed thereon by a CVD process. Then, a resist having a given pattern is formed thereon. The oxide layer, polysilicon layer and buffer oxide layer are successively etched using the resist pattern as a mask. After the resist pattern has been removed, the trench is formed by etching the silicon substrate using the oxide layer as a mask. Then after embedding the insulator in the trench, element isolating regions are formed by performing flattening of the substrate.

Although, the cell size of the memory can be reduced by adopting the foregoing process, a problem occurs that the size of a step difference increases in association with the reduction in cell size when a floating gate and control gate, which are to be laminated to each other are formed.

Since high speed operation is not required when a non-volatile memory is singly used, the resistance of the gate material does not give rise to a great extent. However, in a logic-hybrid memory in which logic circuits are incorporated in the non-volatile memory, an enhancement in the operational speed of the memory is demanded in association with the speeding-up of the logic circuits.

In order to achieve the speeding-up of the operation of the memory, it is important to make the conduction of signal faster by lowering the resistance of polysilicon which is used as a gate material. One method to do this may include lowering of the specific resistivity by doping the polysilicon with, for example, a dopant such as phosphorus. If the gate layer has a thin thickness, the dopant such as phosphorus could penetrate through the gate resulting in doping a dielectric layer which is disposed below the gate, so that the dielectric characteristics will deteriorate.

A method of lowering the resistance of the gate by silicidation of the surface of the gate material including polysilicon is disclosed in Japanese Patent Kokai Publication JP-A-9-283643. A conventional silicidation of polysilicon will now be described with reference to FIGS. 11 through 13. FIGS. 11 and 12 schematically show the sequence of manufacturing process and are divided for convenience of drawing.

Figure 11A:
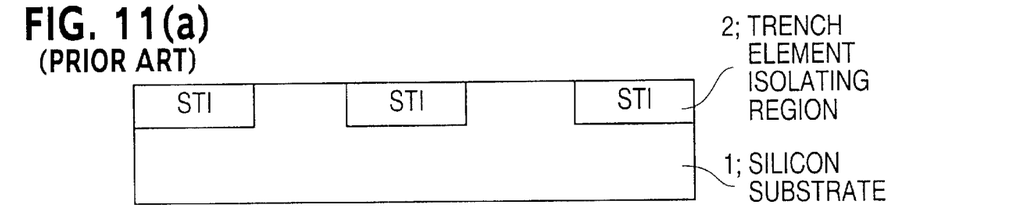
FIGS. 11(a)–11(e) are sectional views explaining a prior art process for manufacturing the non-volatile memory.
Figure 11B:
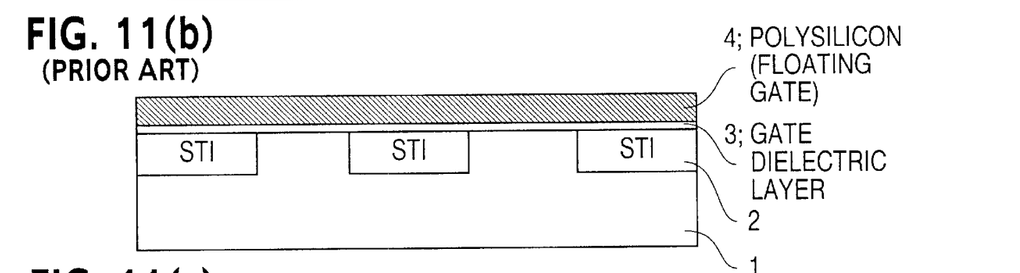
Figure 11C:
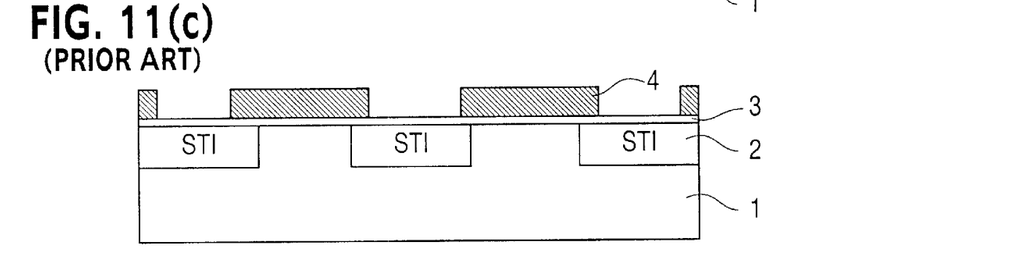
Figure 11D:
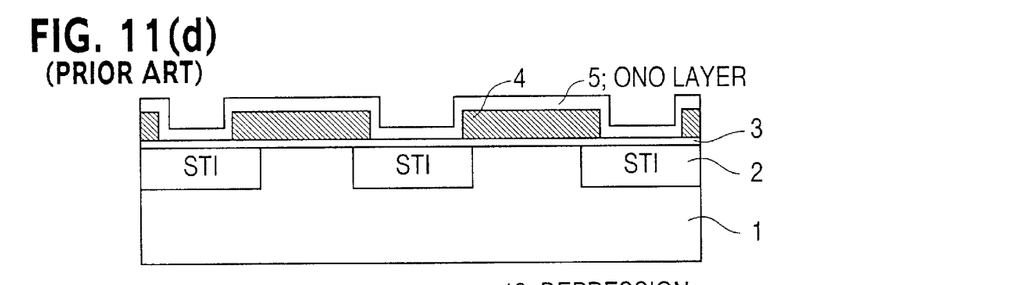

First, as shown in FIG. 11(a), a trench element isolating region 2 is formed on a silicon substrate 1 in accordance with the above-mentioned process and after a gate oxide layer 3 has been formed, polysilicon intended to become a floating gate 4 is deposited thereon (refer to FIG. 11(b)). Then, a resist pattern having a given configuration is formed and a floating gate 4 is formed as shown in FIG. 11(c) by etching the resist pattern.

Figure 11E:
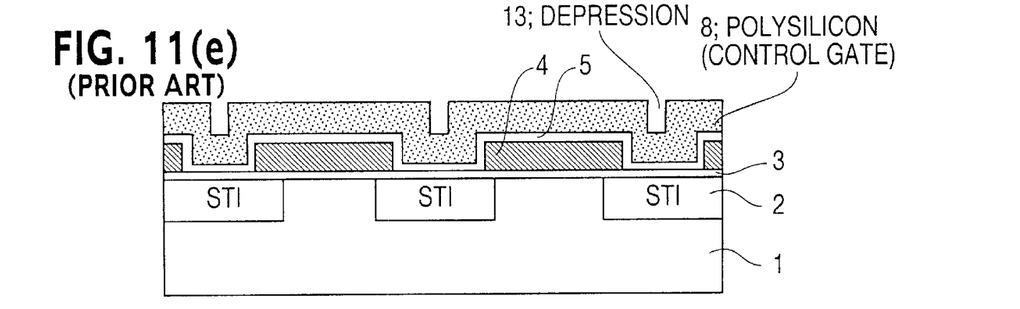

After an interlayer insulating layer (termed herein as "dielectric") such as ONO (Oxide-Nitride-Oxide) layer 5 has been formed in such a manner that it covers the isolated floating gate 4, polysilicon which will become a control gate 8 is deposited and is patterned to a given configuration (refer to FIG. 11(e)).

Figure 12F:
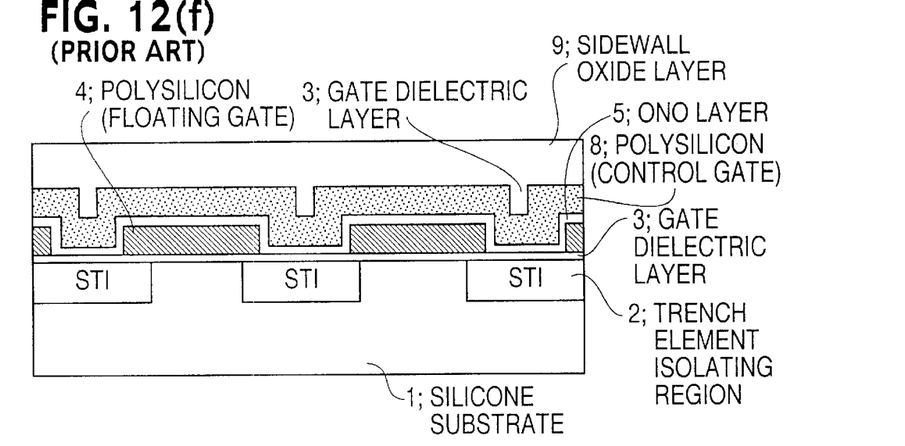
FIGS. 12(f)–12(i) are sectional views explaining the prior art process for manufacturing the non-volatile memory.
Figure 12G:
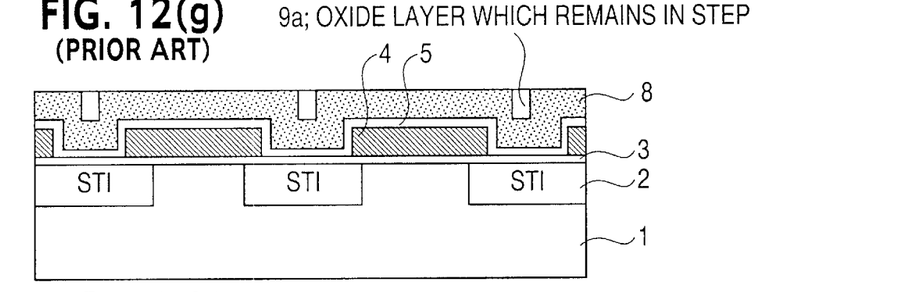

Subsequently, in order to form a sidewall 14 on the lateral wall (not shown) of the control gate, growth and etching back of a sidewall oxide layer 9 is performed (refer to FIGS. 12(f) and (g)). At this time, the control gate will be formed with a depression 13 due to a step difference in association with reduction in spacing of the floating gate 4. The sidewall oxide layer 9 is formed such that it is embedded in the depression 13.

Figure 12H:
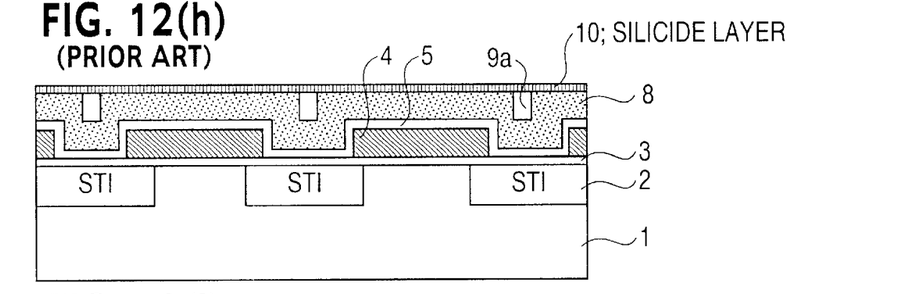
Figure 12I:
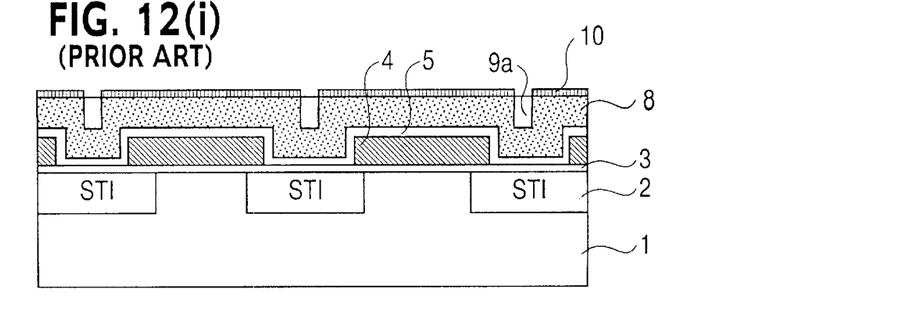
Figure 13A:
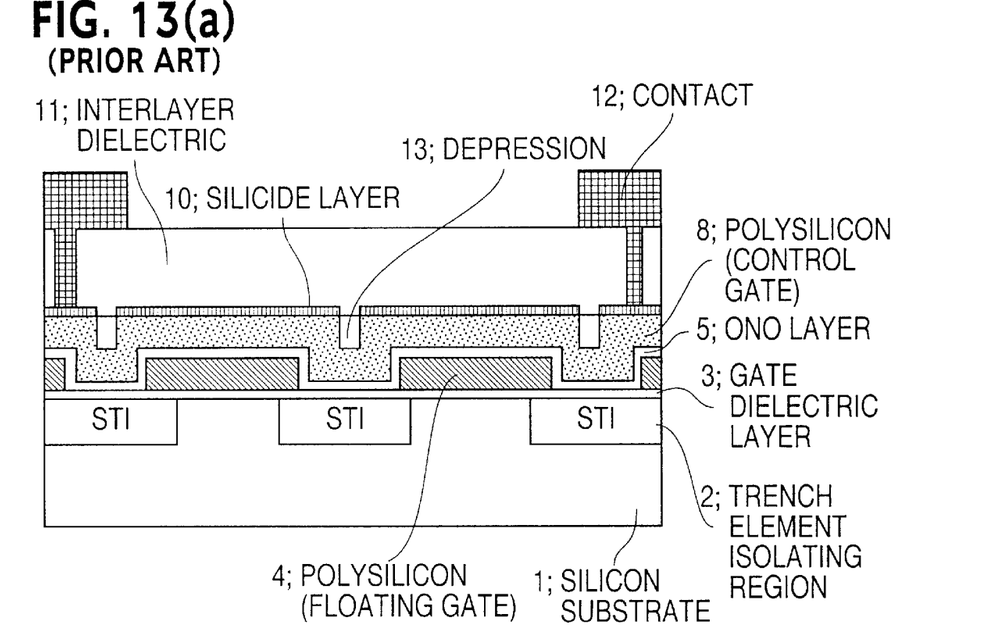
FIGS. 13(a)–13(b) are sectional views explaining the configuration of the prior art non-volatile memory.
Figure 13B:
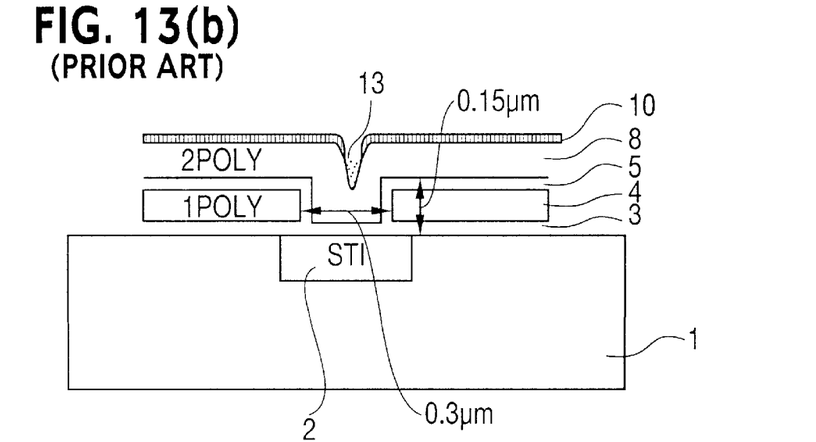

When a titanium silicide layer 10 is formed on the upper face of the control gate 8 by a sputtering process as shown in FIG. 12(h), the silicide layer 10 is deposited on the sidewall oxide layer 9a since a sidewall oxide layer 9 is embedded in the above-mentioned depression 13. Then, etching back of excess titanium is conducted as shown in FIG. 12(i) to remove the silicide layer 10 which has been sputtered on an unwanted region. A structure which is shown in FIG. 13(a) is obtained by subsequently forming the interlayer dielectric 11 and a contact 12.

SUMMARY OF THE DISCLOSURE

In the course of intensive investigations toward the present invention the following problems have been encountered.

If the titanium silicide layer 10 can be uniformly formed over the upper layer of the control gate 8 by adopting the above-mentioned structure, the operation speed of the control gate 8 could be made faster. In accordance with the above-mentioned method, however, the sidewall oxide layer 9 is embedded in the depression 13 formed in the control gate 8 and the silicide layer 10 is deposited upon the sidewall oxide layer 9a. Accordingly, the silicide layer 10 which is deposited upon the above-mentioned sidewall oxide layer 9a will be separated (peeled off) when the excess titanium is etched back.

If there is even one separated point, reduction in resistance of the control gate 8 can not be achieved. This disadvantage becomes remarkable as the spacing between the floating gates 4 become smaller. In a typical non-volatile memory, the thickness of the layer including the gate oxide layer 3, floating gate 4 and ONO layer 5 is about 0.15 µm whereas the spacing between the floating gates 4 is as narrow as about 0.3 µm. The control gate 4 is formed with the depression 13 having a shape which is shown in the drawing. Fracture of the silicide layer 10 may take place at this portion.

The present invention has been achieved to overcome the above-mentioned problem. It is a primary object of the present invention to provide a semiconductor memory device in which no separation of the silicide layer occurs, which is formed on the control gate and a process for manufacturing the same.

In order to accomplish the above-mentioned object, in a first aspect of the present invention, there is provided a semiconductor memory device having a silicon substrate on which a gate dielectric layer, floating gate, interlayer dielectric and a control gate are successively laminated and in which a silicide layer is formed on the surface of the control gate, in which a sidewall which is formed of a plurality members is disposed on the lateral wall of the floating gate.

In a second aspect of the present invention, there is provided a semiconductor memory device having a silicon substrate on which a gate dielectric layer, floating gate, interlayer dielectric and a control gate are successively laminated and in which a silicide layer is formed on the surface of the control gate, in which a sidewall which is formed of a plurality members containing an electrically conductive material is disposed on the lateral wall of the floating gate.

In a third aspect of the present invention, there is provided a semiconductor memory device having a silicon substrate on which a gate dielectric layer, floating gate, inter layer dielectric and a control gate are successively laminated and in which a silicide layer is formed on the surface of the control gate, in which a sidewall comprising a first and second members which are in contact with the lateral wall of the floating gate is disposed on the lateral wall of the floating gate and in that the first member functions as an etching stop for the second member.

In a fourth aspect of the present invention, there is provided a process for manufacturing a semiconductor memory device. The process for manufacturing a semiconductor memory device having a silicon substrate on which a gate dielectric layer, floating gate, interlayer dielectric and a control gate are successively laminated and in which a silicide layer is formed on the surface of the control gate, in which a sidewall which is formed of a plurality members is disposed as a sidewall of the floating gate.

In a fifth aspect of the present invention, there is provided a process for manufacturing a semiconductor memory devices comprising the steps of: (a) forming a gate dielectric layer on a silicon substrate; (b) forming a floating gate on the gate dielectric layer; (c) causing a first member to grow as a film on at least upper and lateral sides of the floating gate; (d) depositing a second member which will become a sidewall over an entire surface of the silicon substrate; (e) forming the sidewall by etching back the second member using the first member as an etching stop so that the second member remains only on the lateral wall of the floating gate; (f) removing the first member which is exposed on an upper surface of the floating gate; (g) causing an interlayer dielectric to grow as a film on upper surfaces of the floating gate, the first and second members; (h) forming a control gate on the interlayer dielectric; and (i) forming a silicide layer on a surface of the control gate.

PREFERRED EMBODIMENTS OF THE INVENTION

In a preferred mode of embodying a non-volatile memory of the present invention, a gate dielectric layer and floating gate (4 in FIG. 4) are formed on a silicon substrate and a sidewall which is made of polysilicon (7 in FIG. 4) is disposed on a lateral wall of the floating gate so that a stop oxide layer (6a in FIG. 4) which functions as an etching stop for the polysilicon is sandwiched therebetween. A control gate (8 in FIG. 4) is laminated on the floating gate having a step difference which is sloped (or slanted) by the sidewall so that an ONO layer (5 in FIG. 4) is sandwiched therebetween.

[Embodiments]

For describing the modes of embodying the above-mentioned invention in more detail, an embodiment of the present invention will be described in detail with reference to drawings.

[Embodiment 1]

Figure 4:
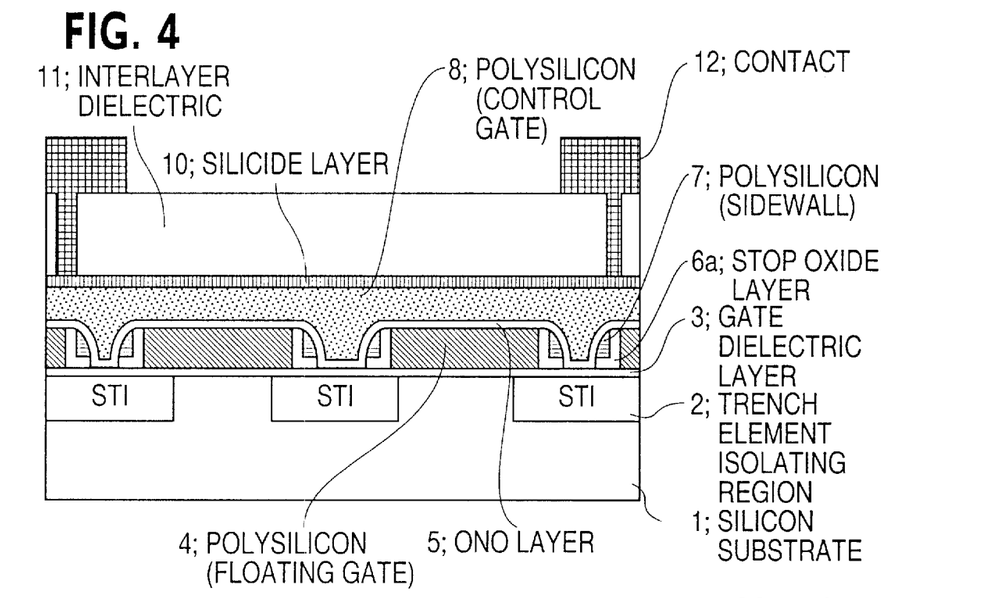
FIG. 4 is a sectional views explaining the configuration of the non-volatile memory of the first embodiment of the invention.
Figure 5:
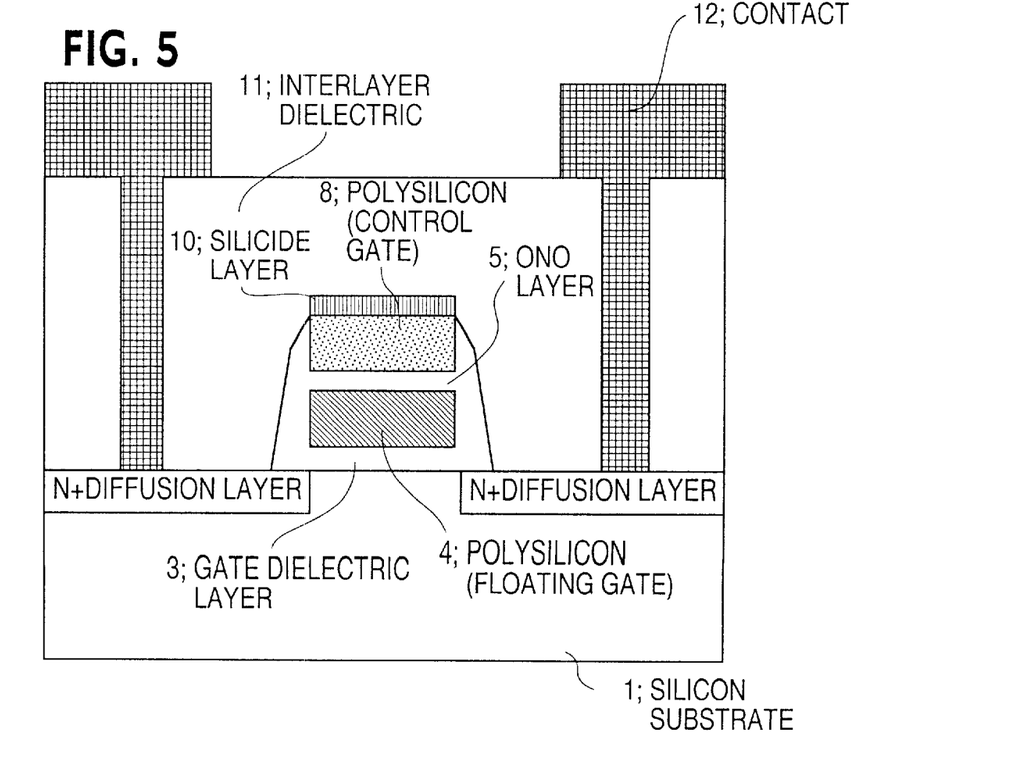
FIG. 5 is a sectional view explaining the configuration of the non-volatile memory of the first embodiment of the invention.
Figure 6:
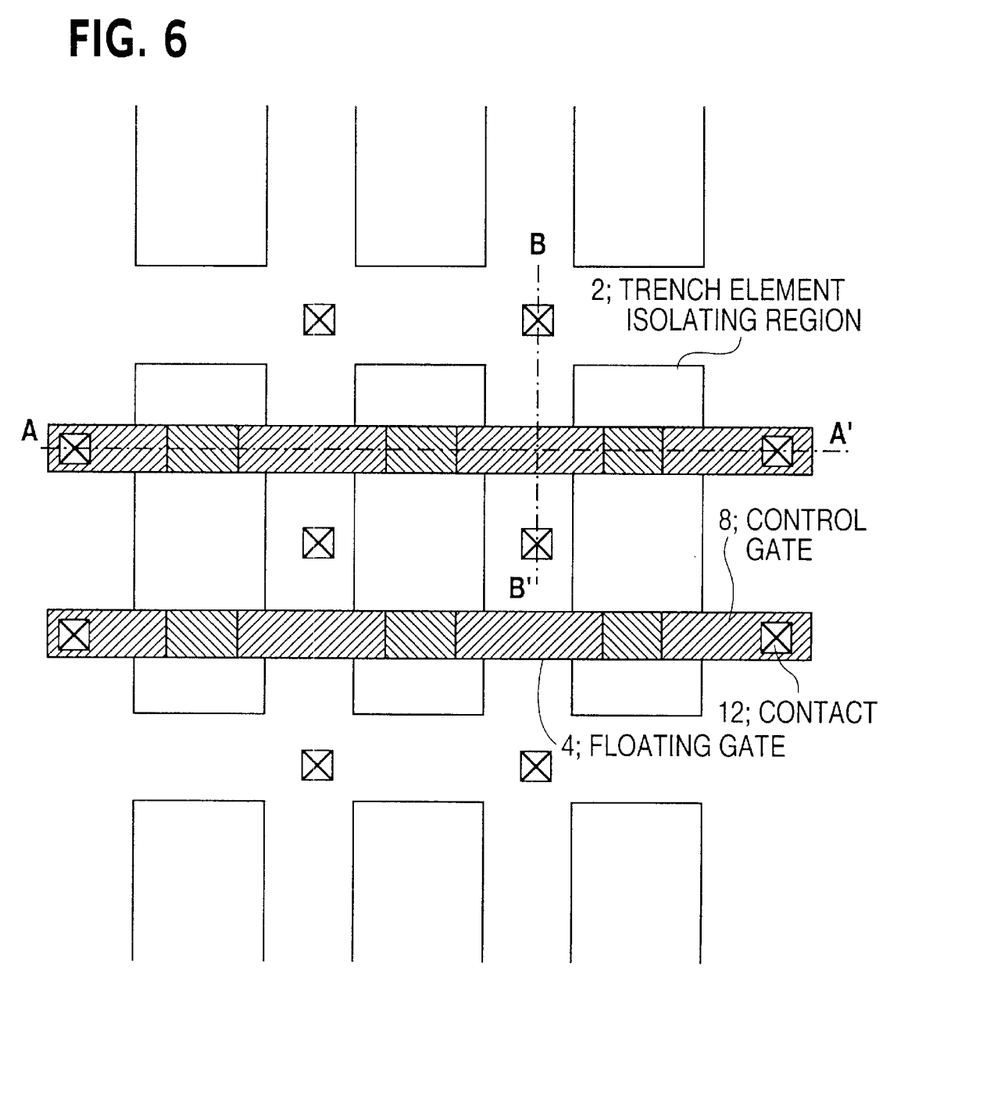
FIG. 6 is a layout view explaining the arrangement of main elements of the non-volatile memory of the first embodiment of the invention.

A non-volatile memory in a first embodiment of the present invention and a process for manufacturing the same will be described with reference to FIGS. 1 through 6. FIG. 1 through 3 are sectional views showing the process for manufacturing the non-volatile memory of the present embodiment in the order of steps. FIGS. 1(a) to 3(l) show a series of manufacturing steps, and are divided for convenience of drawing. FIG. 4 is a sectional view showing the configuration of the non-volatile memory. FIG. 5 is a sectional view showing the configuration of the non-volatile memory as viewed in a direction perpendicular to FIG. 4. FIG. 6 is a layout view showing the arrangement of main elements.

Now, the structure of the non-volatile memory of the present embodiment will be described with reference to FIGS. 4 to 6. FIG. 6 shows the arrangement of the floating gate and the control gate. FIG. 4 is a sectional view taken along a line A–A' in FIG. 6. FIG. 5 is a sectional view taken along a line B–B' in FIG. 6.

As shown in FIG. 4, in the non-volatile memory of the present embodiment, a floating gate 4 is formed on a silicon substrate 1 which is formed with a trench element isolation region 2 in such a manner that a gate dielectric layer 3 is sandwiched between the substrate 1 and the floating gate. 4. The floating gate 4 is provided on its side with a sidewall comprising a stop oxide layer 6a and polysilicon 7 for formulating the step as a slope. A control gate 8 is formed on the floating gate 4 and the sidewall via an ONO layer 5 so that the control gate 8 overlaps the floating gate 4. A silicide layer 10 having a uniform thickness is continuously disposed as an the upper layer on the control gate 8 and is connected with a contact 12 embedded in a contact hole which is formed in an interlayer dielectric layer 11.

A process for manufacturing the non-volatile memory of the present embodiment will be described in the order of steps with reference to FIGS. 1 through 3.

As shown in FIG. 1 (a), the trench element isolating region 2 is formed on the silicon substrate 1 by a known method. In order to form the trench element isolating region 2, a resist layer having a given pattern is formed after the silicon substrate 1 is oxidized by a thickness of about 100 nm. Unwanted oxide layer is removed by etching by using the resist pattern as a mask. Subsequently, the silicon substrate 1 is etched by about 400 nm by using the oxide layer as a mask so that a trench is formed. Thereafter, an oxide layer is embedded in this trench by a CVD process and the oxide layer is flattened by polishing its surface by a CMP (Chemical Mechanical Polishing) process. Then, unwanted oxide layer is removed by a technique such as wet etching so that the silicon substrate is exposed excepting the isolating region.

Figure 1A:
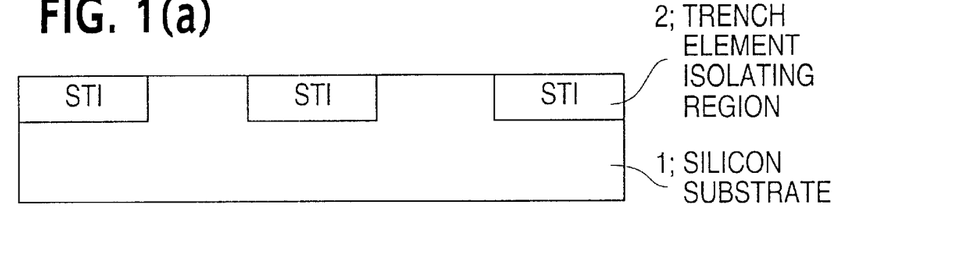
FIGS. 1(a)–1(d) are sectional views schematically explaining a process for manufacturing the non-volatile memory of a first embodiment of the invention.
Figure 1B:
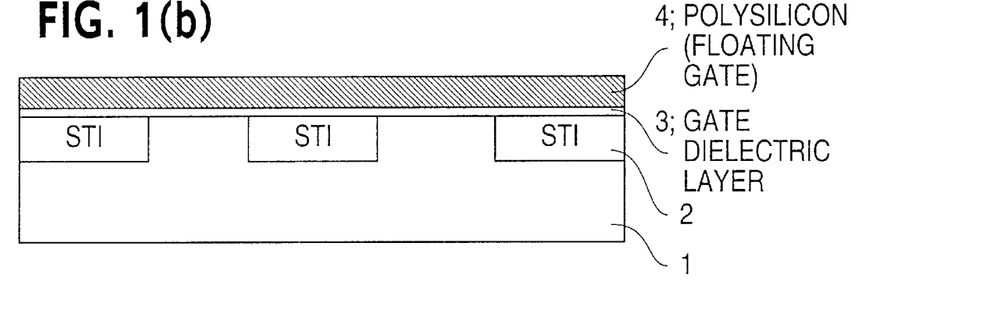
Figure 1C:
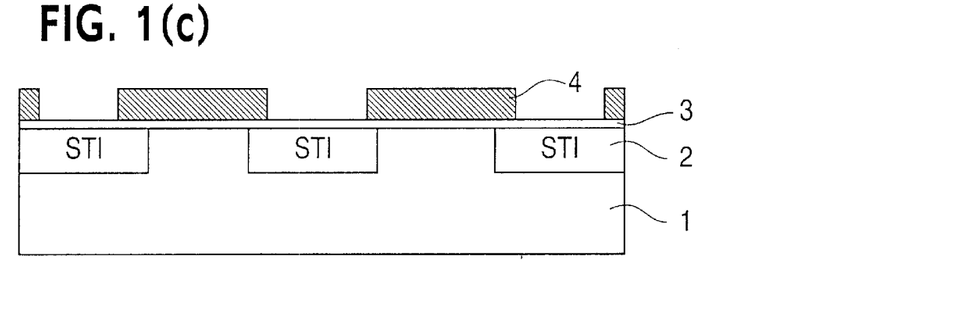

Then, the gate oxide layer 3 having a thickness of about 11 nm is formed over the entire surface of the substrate by a method such as thermal oxidation as shown in FIG. 1(b). A film of polysilicon which will become the floating gate 4 caused to grow to a thickness of about 150 nm on the gate oxide layer 3 by a method such as CVD (Chemical Vapor Deposition). After growth of the film, a resist layer having a given pattern is formed. The floating gate 4 is formed by etching unwanted polysilicon using a resist pattern as a mask (refer to FIG. 1(c)).

Figure 1D:
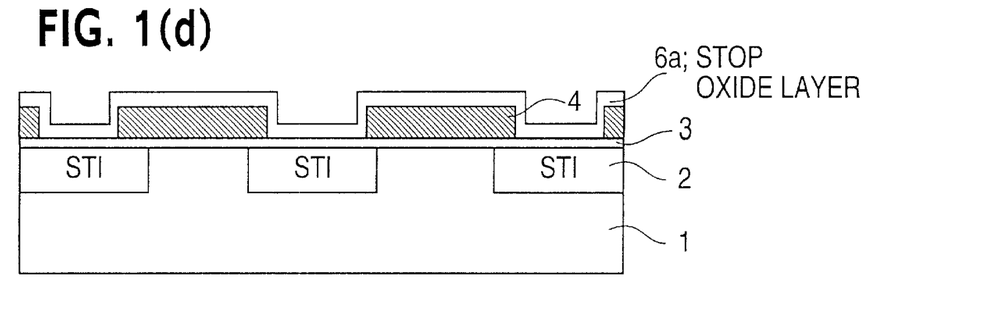

In the present embodiment, a stop oxide layer 6a having a thickness of about 20 nm is formed by thermal a oxidation method so that the layer 6a will cover the upper and lateral sides of the floating gate 4 which is formed into a given configuration as shown in FIG. 1(d). This stop oxide layer 6a will be used as an etching stop when the sidewall is formed on the lateral side of the floating gate 4.

Figure 2E:
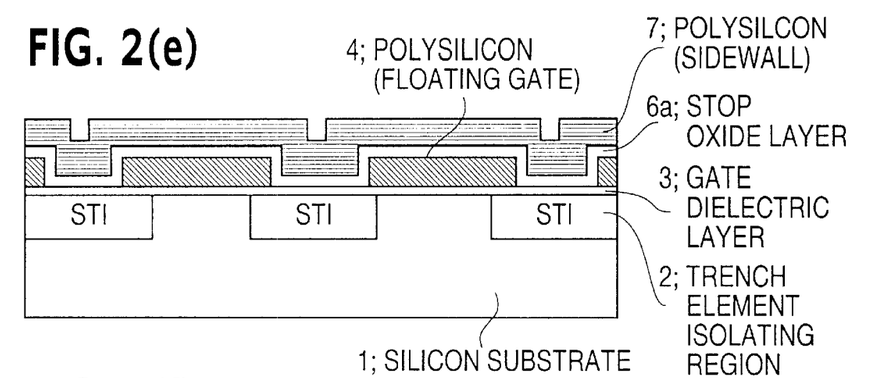
FIGS. 2(e)–2(h) are sectional views schematically explaining a process for manufacturing the non-volatile memory of the first embodiment of the invention.
Figure 2F:
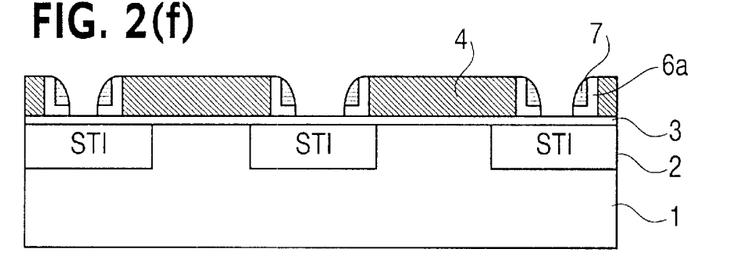

As shown in FIG. 2(e), a polysilicon 7 which will become the sidewall of the floating gate 4 is formed to a thickness of about 200 nm on the stop oxide layer 6a by, for example, a CVD method. Thereafter, the polysilicon is etched back by an anisotropic etching such as dry etching method. Since the stop oxide layer 6a is formed below the polysilicon 7, only the polysilicon 7 can be formed into a given configuration without etching the floating gate 4. When the stop oxide layer 6a is removed by using an etching such as an aqueous solution of fluoric acid after the etching back, a sidewall having a configuration shown in FIG. 2(f) is formed.

Figure 2G:
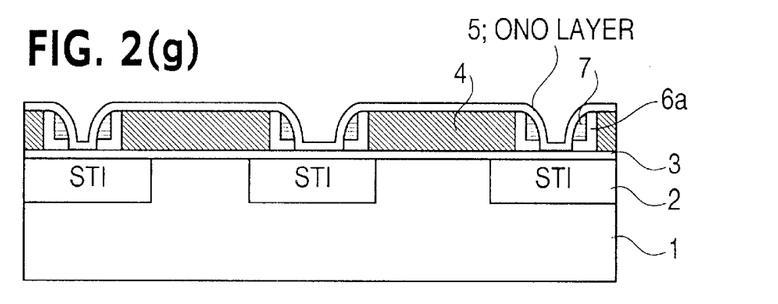
Figure 2H:
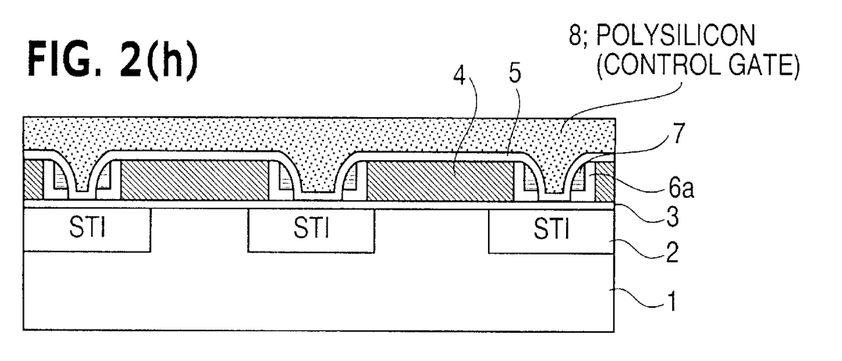

After the ONO layer 5 and the like having a thickness of about 40 nm are formed by, for example, CVD method in such a manner that they cover the floating gate 4 and the sidewall comprising the stop oxide layer 6a and the polysilicon 7 as shown in FIG. 2(g), polysilicon which will become the control gate 8 is deposited (refer to FIG. 2(h)). Since the sidewall having a gradual slope is formed on the lateral side of the floating gate 4 in the present embodiment at this time, no depression 13 will be formed on the surface of the control gate 8 unlike the prior art.

Figure 3I:
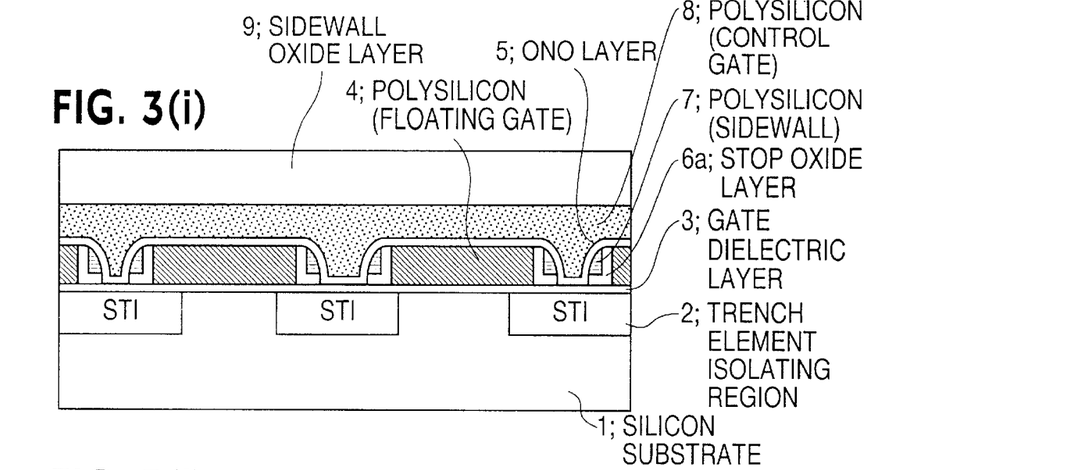
FIGS. 3(i)–3(l) are sectional views schematically explaining a process for manufacturing the non-volatile memory of the first embodiment of the invention.
Figure 3J:
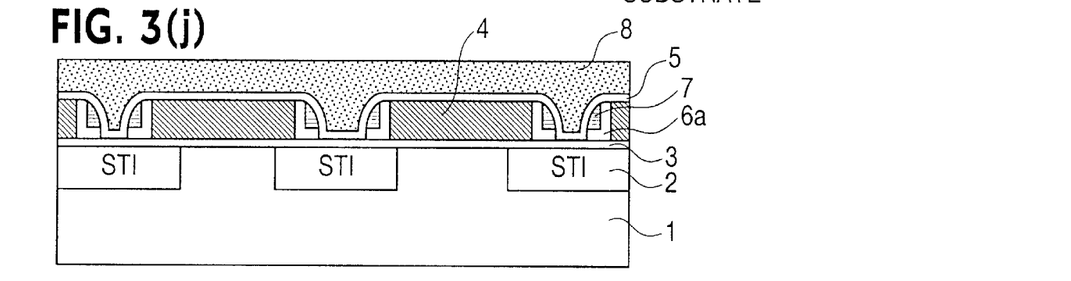

In order to form the sidewall (not shown) on the lateral side of the control gate 8, a sidewall oxide layer 9 is deposited to a thickness of about 150 nm over the entire surface of the substrate by using, for example, CVD process and then etched back (refer to FIGS. 3(i), (j) and FIG. 5. In contrast to the prior art process for manufacturing the non-volatile memory in which the sidewall oxide layer 9 is embedded in the depression 13 in the control gate which is formed above the floating gates 4 due to the step difference between the floating gates 4, no depression is formed in the-control gate 8 by the presence of the sidewall of the polysilicon 7 in the present embodiment. Accordingly, no sidewall oxide layer 9 remains on the control gate 8.

Figure 3K:
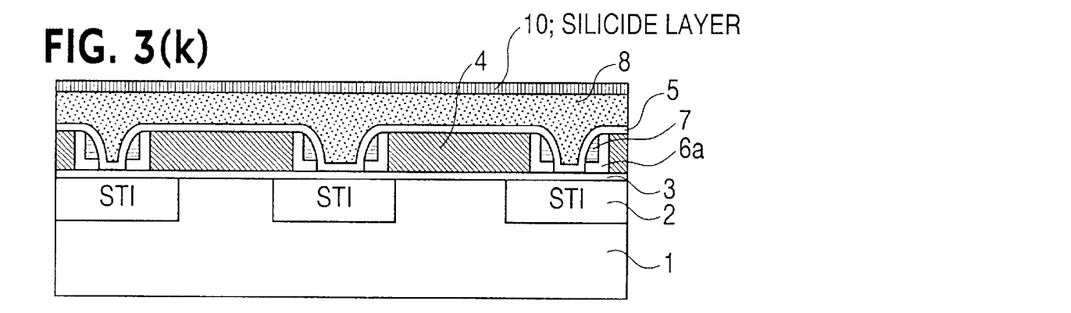
Figure 3L:
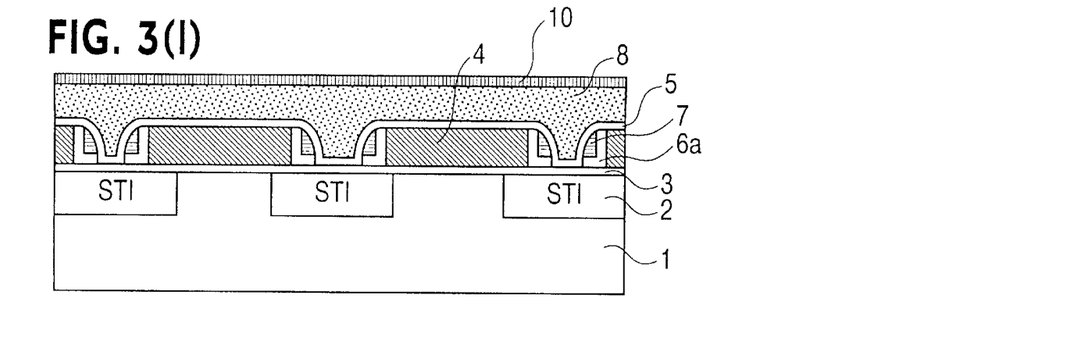

As shown in FIGS. 3(k) and (i), a titanium silicide layer 10 having a thickness about 20 nm is formed on the upper face of the control gate 8 by, for example, sputtering process and unwanted silicide layer is etched. Since no sidewall oxide layer 9 remains on the control gate 8 in the above-mentioned embodiment, the silicide layer 10 can be uniformly formed over the control gate 8. Thereafter, an interlayer dielectric 11 of $SiO_2$ is deposited to a thickness of about 400 nm by, for example, CVD process and then contact holes are formed at respective positions. Thereafter, contacts 12 are formed by embedding a metal such as tungsten in the contact holes. Thus, a non-volatile memory having a configuration shown in FIG. 4 can be obtained.

In the prior art process for manufacturing the non-volatile memory, the depression 13 is formed in the control gate 8 which is formed above the gate due to the step difference between the floating gate 4 in association with reduction in size of gate and the silicide layer 10 which is formed on the control gate 8 is separated due to the fact that the sidewall oxide layer 9 is embedded in the depression. It was difficult to achieve the lowering of the resistance of the control gate 8 in the prior art.

However, since the formation, of the depression 13 in the control gate 8 can be prevented by forming the sidewall made of the polysilicon 7 on the lateral side of the floating gate 4 by using the stop oxide layer 6a as an etching stop in the manufacturing process of the present embodiment, the silicide layer 10 which is formed on the control gate 8 is not separated, which effectively making the resistance of the control gate 8 lower.

On the other hand, if the sidewall made of only oxide layer is formed on the lateral side of the floating gate 4, the floating gate 4 is exposed on its surface to an etching gas for dry etching since the termination point of the etching can not be detected when an anisotropic dry etching is performed for providing the configuration as shown in FIG. 2(f), resulting in an damage. Accordingly, the quality of the ONO layer deteriorates and the reliability on the device will become remarkably worse. Therefore, the device characteristic can be otherwise kept excellent by only the sidewall having the configuration of the present embodiment.

[Embodiment 2]

Now, a non-volatile memory of a second embodiment of the present invention and a process for manufacturing the same will be described with reference to FIGS. 7 through 10. FIGS. 7 through 9 show the process for manufacturing the non-volatile memory of the second embodiment in order of steps. FIG. 7(a) through FIG. 9(l) show a series of manufacturing steps and are divided for convenience of drawing. FIG. 10 is a circuit diagram explaining the relation between the gate voltage and the capacity.

The difference between the present invention and the above-mentioned first embodiment resides in that a naturally oxidized layer is formed as a stop oxide layer in the present embodiment.

Now, the process for manufacturing the non-volatile memory of the present embodiment will be described in order of steps with reference to FIG. 7 through 9.

As is similar to the above-mentioned first embodiment, the trench element isolating region 2 is formed on the silicon substrate 1 by a known method. The gate oxide layer 3 having a thickness of about 11 nm is formed over the entire surface of the substrate 1 by a method such as thermal oxidation method. The film of the polysilicon which will become the floating gate 4 is formed to a thickness of about 150 nm above the gate oxide layer 3 by a CVD process and the like. After formation of the film, a resist layer having a given pattern is formed. Unwanted polysilicon is removed by etching using the resist pattern as a mask (refer to FIGS. 7(a) through (c)).

Figure 7A:
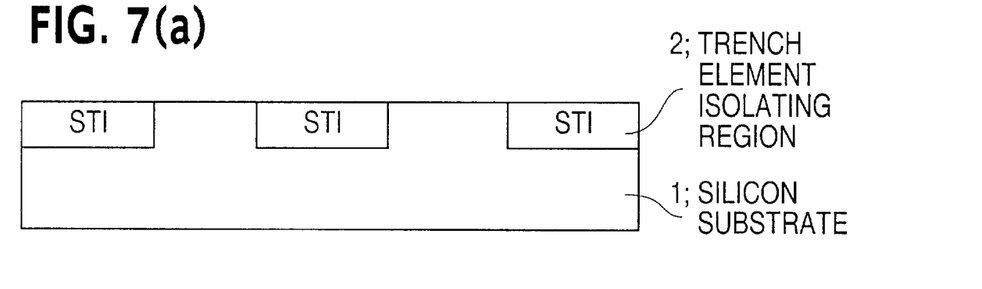
FIGS. 7(a)–7(d) are sectional views schematically explaining a process for manufacturing a non-volatile memory of a second embodiment of the invention.
Figure 7B:
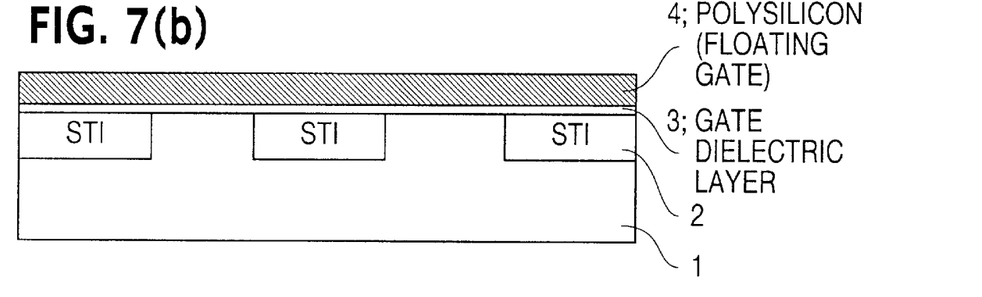
Figure 7C:
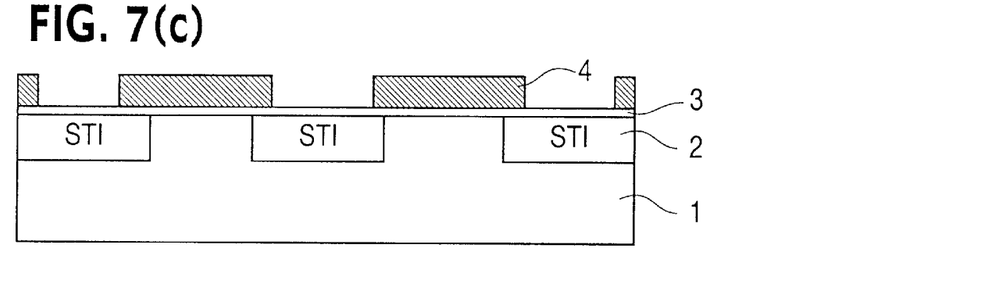
Figure 7D:
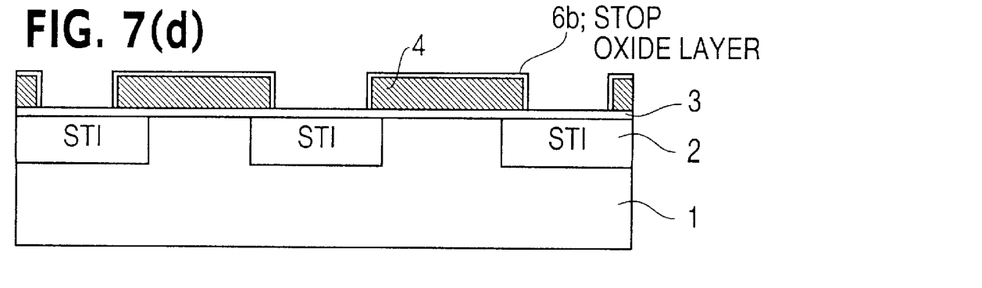

In the present embodiment, a stop oxide layer 6b made of a naturally oxidized layer is formed on the surface of the floating gate 4 by leaving the entire of the substrate to stand in the atmosphere after the polysilicon has been etched. Unlike the above-mentioned first embodiment, no special additional step is required for the formation of the oxide layer since the formed naturally oxidized layer can be used as an etching stop when the sidewall is formed on the lateral side of the floating gate 4. Reduction in the number of steps in comparison to that in the first embodiment can be achieved.

Figure 8E:
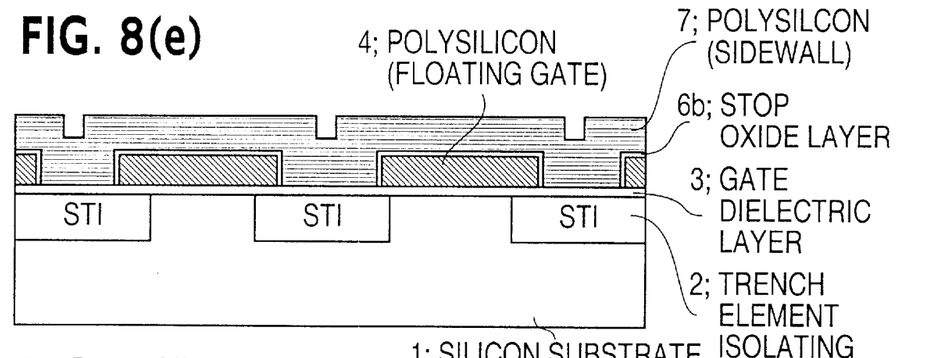
FIGS. 8(e)–8(h) are sectional views schematically explaining a process for manufacturing the non-volatile memory of the second embodiment of the invention.
Figure 8F:
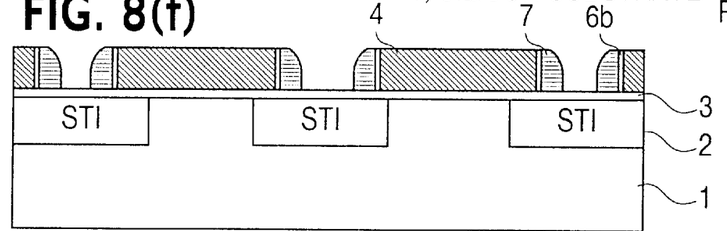

Then, as shown in FIG. 8(e), the polysilicon 7 which will become the sidewall of the floating gate 4 is formed to the film thickness of about 200 nm on the stop oxide layer 6b by, for example, a CVD process. Thereafter, the polysilicon 7 is etched back by an anisotropic dry etching and the like. Since the stop oxide layer 6b is formed below the polysilicon 7 at this time, no floating gate 4 is etched so that only the polysilicon 7 is formed into a given configuration. If the stop oxide layer 6b is removed by using, for example, an etchant such as aqueous solution of fluoric acid after etching back, the sidewall having the configuration as shown in FIG. 8(f) is formed.

Since the naturally oxidized layer which is formed on the lateral side of the floating gate 4 is sufficiently thin in the present embodiment, the floating gate 4 can be electrically connected with the polysilicon 7 which constitutes the sidewall. Accordingly, the surface area of the floating gate 4 can be effectively increased. Therefore, the capacity between the floating gate 4 and the control gate 8 can be made larger than that in the first embodiment.

In other words, Since the applied voltage Vg satisfies the relation (1) wherein Ctun denotes the capacity between the silicon substrate 1 and the floating gate 4, Cono denotes the capacity between the floating gate 4 and the control gate 8 and Vf denotes the floating gate voltage as shown in FIG. 10, the voltage Vf increases as the intergate capacity Cono increases, so that the applied voltage Vg can be effectively conducted to a tunnel oxide layer.

$$Vf = Cono^2/(Cono^2 + Ctun^2) \times Vg \quad (1)$$

Figure 8G:
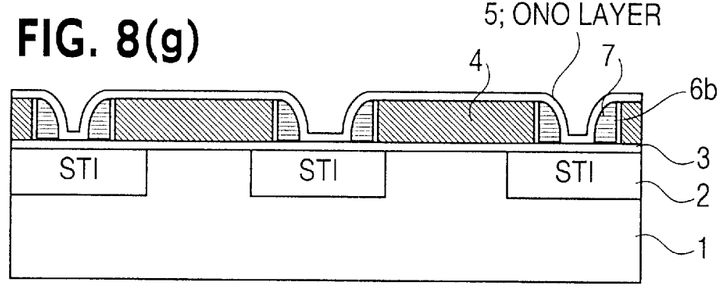
Figure 8H:
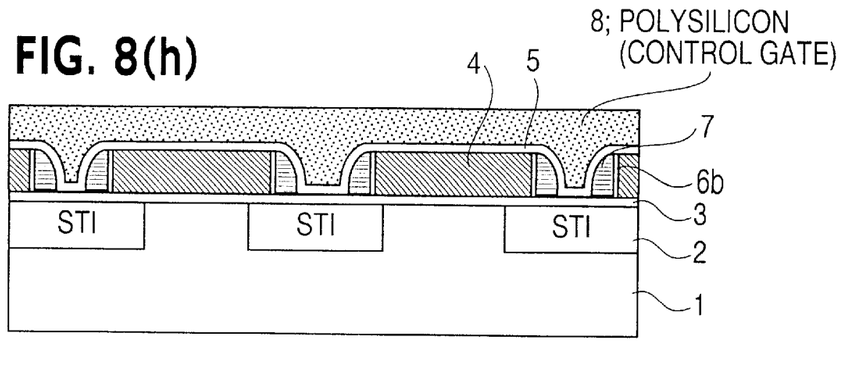

After the ONO layer 5 and the like are formed for covering the floating gate 4 and the sidewall comprising the stop oxide layer 6b and the polysilicon 7 as shown in FIG. 8(g), the polysilicon which will become the control gate 8 is deposited thereon (refer to FIG. 8(h)). In order to form the sidewall on the lateral wall of the control gate 8, the sidewall oxide layer 9 is deposited over the entire surface of the substrate and thereafter etching back is performed (refer to FIGS. 9(i), (j). Since the sidewall having a gradual slope is formed on the lateral side of the floating gate 4 in the present embodiment as is similar to the above-mentioned first embodiment, no depression 13 is formed on the surface of the gate control 8 unlike the prior art.

Figure 9I:
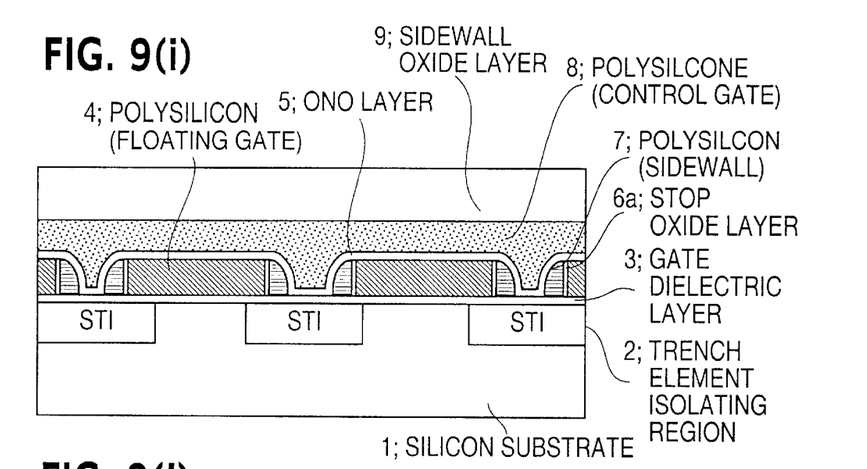
FIGS. 9(i)–9(l) are sectional views schematically explaining a process for manufacturing the non-volatile memory of the second embodiment of the invention.
Figure 9J:
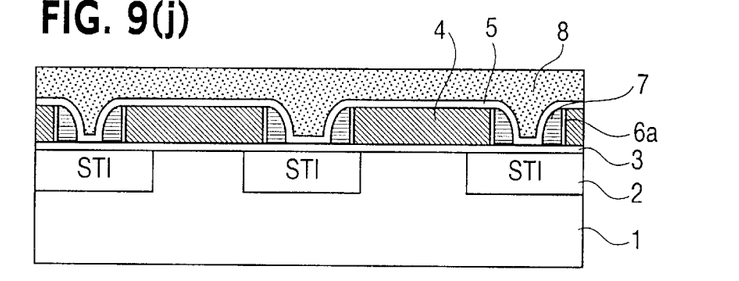
Figure 9K:
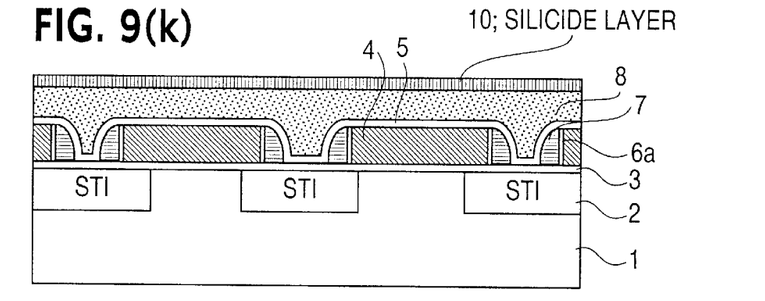
Figure 9L:
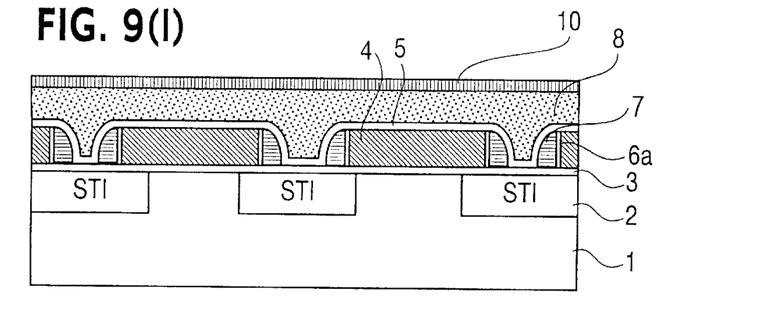
Figure 10:
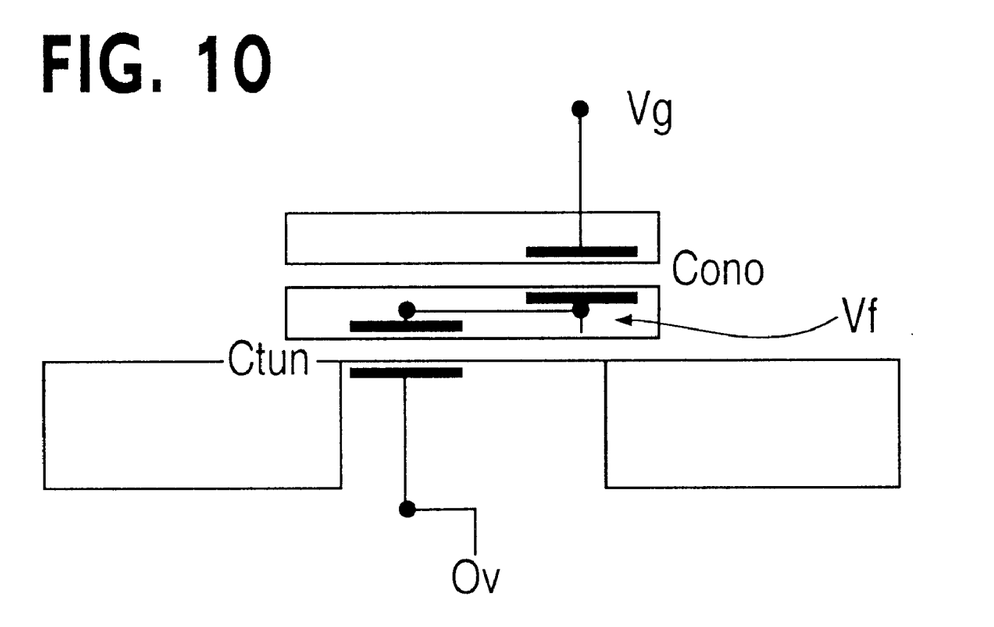
FIG. 10 is a circuit diagram explaining the function of the non-volatile memory of the invention.

After the titanium silicide layer 10 is formed on the upper side of the control gate 8 as shown in FIGS. 9(k), (l) etching of excess titanium is conducted. Since no sidewall oxide layer 9 remains on the control gate 8 in the present embodiment as mentioned above, the silicide layer 10 is uniformly formed over the control gate 8. Thereafter, the interlayer dielectric 11 is deposited and the contact 12 is formed in position. Thus, the non-volatile memory can be manufactured.

Since the formation of the depression 13 in the control gate 8 can be prevented by forming the sidewall made of the polysilicon 7 on the lateral side of the floating gate 4 by using the stop oxide layer 6b as an etching stop in accordance with the manufacturing process of the present embodiment, no silicide layer 10 which is formed on the control gate 8 is not separated, so that the resistance of the control gate 8 can be effectively lowered.

Since the naturally oxidized layer which is formed on the lateral side of the floating gate 4 is sufficiently thin in the present embodiment, the floating gate 4 can be electrically connected with the polysilicon 7 of the sidewall so that the surface area of the floating gate 8 can be effectively increased. Therefore, the capacitance between the floating gate 4 and the control gate 8 can be made larger than that of the first embodiment.

Although the present invention has been described with reference to the embodiments in which the sidewall of the floating gate 4 comprises the stop oxide layers 6a, 6b and the polysilicon 7, the present invention is not limited to the above-mentioned embodiments. The stop oxide layer may be any material if it functions as the etching stop for the sidewall. For example, it may be nitride layer and the like. Polysilicon which is used as the material of the sidewall may be replaced with, for example, amorphous silicon.

Although the present invention has been described with reference to the case where the element isolation is performed by an STI process, it is to be understood that the element isolation can be performed by another process such as LOCOS process and that titanium which is used for the silicide layer may be replaced with other metals such as tungsten, molybdenum and platinum.

The meritorious effects of the present invention are summarized as follows.

As mentioned above, the silicide layer which makes the resistance of the control gate lower can be formed at an uniform thickness in accordance with the present invention. Therefore, the present invention provides an advantage that the operation speed of the non-volatile memory can be positively made faster.

The reason is as follows. Since the formation of the depression in the control gate can be prevented by forming, on the lateral side of the floating gate, the sidewall which comprises the polysilicon and the stop oxide layer which functions as an etching stop for the polysilicon, the silicide layer which is formed on the control gate is not separated, so that the resistance of the control can be effectively made lower.

In accordance with the present invention, the floating gate is electrically connected with the sidewall by forming as the naturally oxidized layer as the etching stop oxide layer which is formed on the lateral side of the floating gate. Accordingly, an effective increase in the surface area of the floating gate can increase the capacity between the floating gate and control gate.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A process for manufacturing a semiconductor memory device comprising the steps of:
    (a) forming a gate dielectric layer on a silicon substrate;
    (b) forming a floating gate on said gate dielectric layer;
    (c) causing a first member to grow as a film on at least upper and lateral sides of said floating gate;
    (d) depositing a second member which will become a sidewall over an entire surface of said silicon substrate;
    (e) forming said sidewall by etching back said second member by using said first member as an etching stop so that said second member remains only on the lateral sides of said floating gate;
    (f) removing said first member which is exposed on an upper surface of said floating gate;
    (g) causing an interlayer dielectric to grow as a film on upper surfaces of said floating gate and said first and second members;
    (h) forming a control gate on said interlayer dielectric; and
    (i) forming a silicide layer on a surface of said control gate.

2. A process for producing a semiconductor memory device as defined in claim 1, wherein said first member comprises a silicon oxide layer and said second member comprises polysilicon.

3. A process for manufacturing a semiconductor memory device as defined in claim 1, wherein said silicon oxide layer is formed by a thermal oxidation or chemical vapor deposition process.

4. A process for manufacturing a semiconductor memory device as defined in claim 2, wherein said silicon oxide layer comprises a naturally oxidized layer, which has such a thickness that said floating gate lateral wall is electrically connected with the second member.

5. A process for manufacturing a semiconductor memory device as defined in claim 1, wherein said silicide layer comprises a titanium silicide layer.

6. A process for manufacturing a semiconductor memory device, comprising:
    (a) forming a gate dielectric layer on a silicon substrate;
    (b) forming a floating gate on said gate dielectric layer;
    (c) causing a first member to grow as a film on at least upper and lateral sides of said floating gate;
    (d) depositing a second member which will become a sidewall over an entire surface of said silicon substrate;
    (e) forming said sidewall by etching back said second member using said first member as an etching stop such that said second member remains only on the lateral sides of said floating gate; and
    (f) removing said first member which is exposed on an upper surface of said floating gate.

7. The process claimed in claim 6, further comprising:
    (g) causing an interlayer dielectric to grow as a film on upper surface of said floating gate and said first and second members.

8. The process claimed in claim 7, further comprising:
    (h) forming a control gate on said interlayer dielectric.

9. The process claimed in claim 8, further comprising:
    (i) forming a silicide layer on a surface of said control gate.

10. The process claimed in claim 6, wherein said first member comprises a silicon oxide layer and said second member comprises polysilicon.

11. The process claimed in claim 10, wherein said silicon oxide layer comprises a naturally oxidized layer having such a thickness that said floating gate lateral wall is electrically connected with the second member.

12. The process claimed in claim 10, wherein said silicon oxide layer is formed by a thermal oxidation or chemical vapor deposition process.

* * * * *